United States Patent [19]

Gaddis

[11] Patent Number: 5,090,121
[45] Date of Patent: Feb. 25, 1992

[54] APPARATUS AND METHOD FOR FABRICATING CIRUCIT PATTERN ON CONDUCTIVE SURFACE OF CIRCUIT BOARD

[75] Inventor: Ronald A. Gaddis, Lubbock, Tex.

[73] Assignee: Texas Instruments Incorporated, Dallas, Tex.

[21] Appl. No.: 603,607

[22] Filed: Oct. 30, 1990

[51] Int. Cl.⁵ .................. H05K 3/02; B23K 31/06
[52] U.S. Cl. .......................... 29/847; 29/745; 219/69.17
[58] Field of Search .............. 29/847, 846, 745; 364/488, 489; 219/69.11, 69.12, 69.17

[56] References Cited

U.S. PATENT DOCUMENTS 4,735,678  4/1988  Mandigo et al. ............ 219/69.17 X

FOREIGN PATENT DOCUMENTS 2149580  6/1985  United Kingdom .

OTHER PUBLICATIONS

IBM Tech. Dicl. Bull. vol. 24, No. 12 May 1982 pp. 6383-6384 by J. Funari et al. (219/69.17).

*Primary Examiner*—Carl J. Arbes
*Attorney, Agent, or Firm*—William E. Hiller; Richard L. Donaldson

[57] ABSTRACT

A circuit fabrication device (10) is used to develop production or prototype circuits. A circuit board (16) having a conductive layer (26) provided thereon is placed in a plotter (14). An electrode (20) connected to a power supply (18) "draws" on the circuit board, thereby vaporizing piortions of the conductive layer patterned conductive regions (30) are thus formed on the conductive layer separated by isolation regions (28) where the portions of the conductive layer have been removed by vaporization in defining a circuit pattern on the conductive layer of the circuit board.

11 Claims, 1 Drawing Sheet

APPARATUS AND METHOD FOR FABRICATING CIRUCIT PATTERN ON CONDUCTIVE SURFACE OF CIRCUIT BOARD

TECHNICAL FIELD OF THE INVENTION

This invention relates in general to electronic circuits, and more particularly to a apparatus and method for producing prototype electronic circuits.

BACKGROUND OF THE INVENTION

The development cycle associated with the commercial realization of an electronic circuit involves several steps. First, the circuit is designed schematically, either by hand or using a computer-aided design (CAD) system. The schematic is used to design an initial prototype which will be used to test the circuit for operability, and also to develop the mechanical features which will be used in the final product. Several of the prototypes are then produced for testing. Typically, modifications are made to the prototype leading up to a final working model which will be mass-produced.

In the prior art, A prototype circuit board would need to be produced for each prototype. This method has several disadvantages. First, the time and cost of producing multiple prototype circuit boards is significant. Second, changes to the prototype boards often necessitates fabrication of new prototype boards, which results in further costs and time delays.

Therefore, a need has arisen in the industry to provide a apparatus and method for producing circuits which is inexpensive and which facilitates changes to and reproduction of prototype circuits.

SUMMARY OF THE INVENTION

In accordance with the present invention, a method and apparatus for producing prototypes is provided which substantially eliminates the problems associated with prior prototype development systems.

In the present invention, an apparatus and method for developing circuit patterns is provided in which a circuit board having a conductive surface formed thereon is placed in a plotting device operable to receive the circuit board. A plotting head is coupled to the plotting device for removing portions of the conductive surface from the circuit board.

In a second embodiment of the present invention, a circuit board having a conductive surface formed thereon is placed in a plotting device operable to receive the circuit board. An electrode is coupled to the plotting device for removing portions of the conductive surface from the circuit board by applying a voltage thereto. A computer control plotting device moves the plotting head in a predetermined pattern.

This aspect of the present invention provides several technical advantages over the prior art. First, the present invention allows circuits to be created very quickly. Changes to these circuits can be incorporated as needed with minimum delay. Further, present invention is cost effective for designing prototype circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
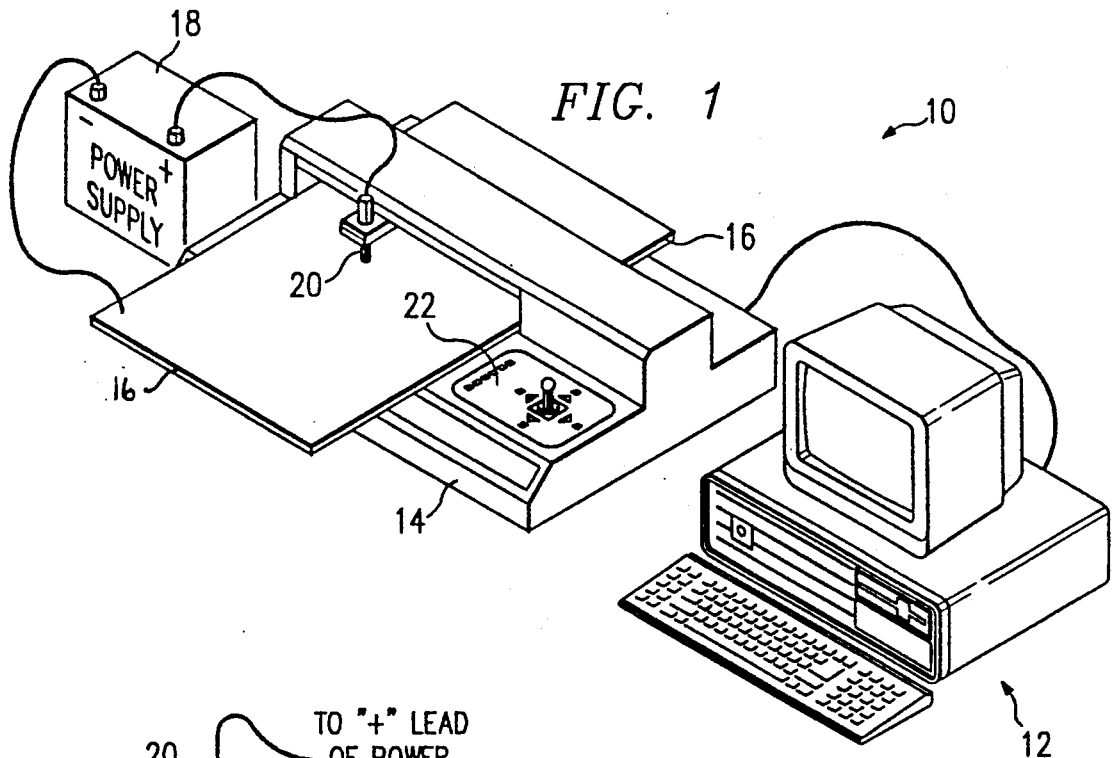
FIG. 1 illustrates a perspective view of the present invention.
Figure 2:
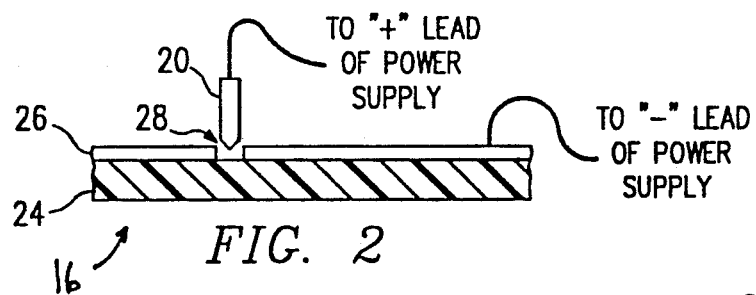
FIG. 2 illustrates a cross-sectional side view of the circuit board material.
Figure 3:
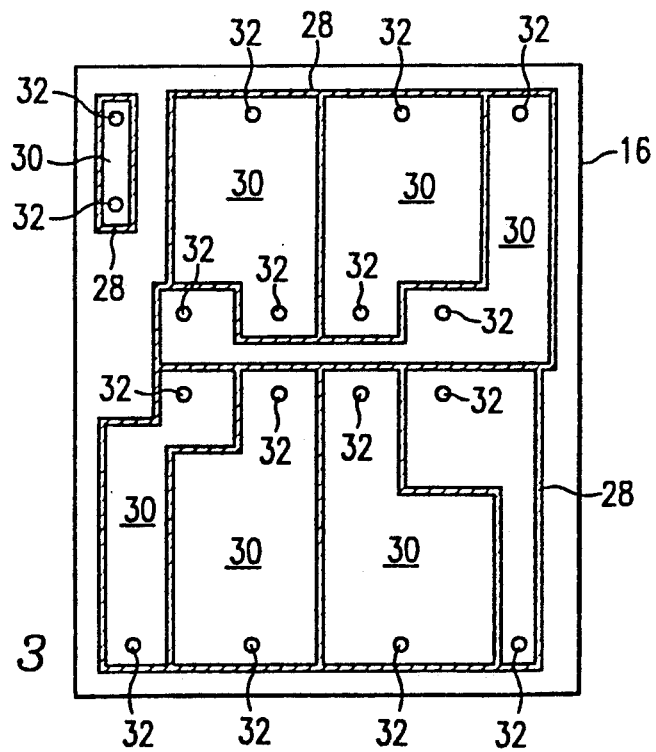
FIG. 3 illustrates a top plan view of an exemplary circuit produced by the present invention.

The preferred embodiment of the present invention and its advantages are best understood by referring to FIGS. 1-3 of the drawings, like numerals being used for like and corresponding parts of the various drawings.

FIG. 1 illustrates a perspective view of the circuit fabrication device 10 of the present invention In the preferred embodiment, the circuit fabrication device 10 comprises a computer 12 connected to a plotter 14 having a circuit board 16 placed therein. A power supply 18 (typically supplying about ten volts) is connected between the conductive surface of the circuit board 16 (see FIG. 2) and an electrode 20 controlled by the plotter 14. The electrode should have a sharp pointed tip and can be made from almost any conductive material. As well as computer control, the plotter 14 includes manual controls 22 for moving the electrode 20 under user control.

FIG. 2 illustrates a cross-sectional side view of the circuit board 16. In the preferred embodiment, the circuit board 16 comprises a Mylar film base layer 24 having a conductive layer 26 formed thereon. Typically, the conductive layer 26 comprises a copper layer which is sputtered onto the base layer 24. Gold and platinum conductive layers are also available from a variety of manufacturers. The electrode 20 is placed in the plotter 14 where the pin would typically be placed. The electrode 20 may be moved vertically such that it is either placed in contact with the conductive layer 26 or is removed from contact with the conductive layer 26. The electrode 20 may also be moved in the plane of the circuit board 16. In the illustrated embodiment of FIG. 1, the electrode 20 moves in an X direction and the circuit board 12 moves in a Y direction. However, other plotting devices may receive the circuit board 16 in a stationary position and move the electrode 20 in both X and Y directions to pattern the circuit board.

As illustrated in FIG. 2, when the electrode 20 is placed in contact with the conductive layer 26 of the circuit board 16, and a voltage is applied between the electrode 20 and conductive layer 26, the portion of the conductive layer 26 proximate the electrode 20 is vaporized. Hence, an isolation region 28 is formed on the circuit board 16. As the electrode 20 plots, the metal material is vaporized leaving conductive islands which may be used to connect nodes of the devices used in the circuit.

FIG. 3 illustrates a exemplary circuit formed using the circuit fabrication device 10. The plotter 14 creates isolation regions 28 by "drawing" on the circuit board 16 with the electrode 20. Conductive islands 30 are thus formed, separated by isolation regions 28, connecting nodes 32, as desired.

The line widths of the isolation regions 28 may be varied by controlling the voltage and plotter speed. The resulting conductive regions 30 may have a resolution of at least 0.020 inches. The widths of the isolation regions are typically about 0.010 inches, and may be varied somewhat by the speed of the drawing process;

the slower the movement between the electrode 20 and circuit board 16, the wider the isolation region will be.

While the plotter may be operated manually using manual controls 22, the most efficient method of drawing circuits is under computer control. The circuits can be designed using any CAD program which interfaces to a plotter. Further, it would possible to design a program which would automatically transform an electrical schematic into a circuit diagram to be plotted. Computer control of the plotter allows easy modification and reproduction of circuits.

The present invention provides significant advantages. The circuit fabrication device 10 may be used to produce both prototype and production circuits in the place of ordinary printed circuit board technology. The creation of the circuits may be extremely fast and changes can be quickly incorporated into the design. The cost of the system is low in comparison with other such devices.

Although the present invention and its advantages have been described in detail, it should be understood that various changes, substitutions and alterations can be made herein without departing from the spirit and scope of the invention as defined by the appended claims.

What is claimed is:

1. A method for producing an electronic circuit comprising the steps of:
   disposing an electrode having an electrode tip in operative relationship with respect to a circuit board having a conductive surface provided thereon;
   imparting relative movement between said electrode and said circuit board for positioning the electrode tip of said electrode in contact with the conductive surface of said circuit board;
   applying voltage between said electrode and the conductive surface of the circuit board;
   drawing on the conductive surface of the circuit board with the electrode tip of said electrode in a plotting pattern while the electrode tip is disposed in contact with the conductive surface and voltage is applied between said electrode and the conductive surface of the circuit board; and
   removing conductive material from the conductive surface of said circuit board to produce a circuit pattern in the conductive surface of said circuit board corresponding to the plotting pattern when the electrode tip is in contact with the conductive surface and voltage is being applied between said electrode and the conductive surface of said circuit board.

2. A method as set forth in claim 1, wherein the application of voltage between said electrode and the conductive surface of said circuit board is at a voltage magnitude sufficient to vaporize conductive material from the conductive surface of said circuit board in areas of contact between the electrode tip of said electrode and the conductive surface of said circuit board.

3. A method as set forth in claim 1, wherein the electrode is coupled to a plotting device, and further comprising:
   placing the circuit board having the conductive surface provided thereon in the plotting device;
   moving the circuit board with the conductive surface provided thereon via said plotting device in a Y-axis direction for disposing the electrode tip of said electrode in contact with the conductive surface of said circuit board; and
   moving said electrode via said plotting device in an X-axis direction with respect to the conductive surface provided on said circuit board with the electrode tip of said electrode being movable in the plane of the conductive surface of said circuit board and in contact therewith in defining the plotting pattern under the control of said plotting device.

4. A method as set forth in claim 3, further including controlling the movement of said electrode with respect to the conductive surface of said circuit board in tracing out the plotting pattern by a computer interfaced with said plotting device via execution of a computer program determining the plotting pattern.

5. Apparatus for producing a circuit pattern on a circuit board having a conductive surface provided thereon, said apparatus comprising:
   a plotting device adapted to receive the circuit board with the conductive surface thereof exposed for patterning;
   an electrode coupled to said plotting device and having an electrode tip adapted to be disposed in proximity to the conductive surface on the circuit board;
   said electrode being relatively movable in a direction substantially normal with respect to the circuit board as received by the plotting device for disposing the electrode tip thereof in contact with the conductive surface of the circuit board and for removing the electrode tip thereof from contact with the conductive surface of the circuit board;
   said electrode being further relatively movable with respect to the circuit board as received by the plotting device to enable the electrode tip of said electrode to undergo relative movement with respect to the circuit board in the plane of the conductive surface thereof;
   means for applying voltage between said electrode and the conductive surface of the circuit board;
   said plotting device drawing on the conductive surface of the circuit board via the electrode tip of said electrode in a plotting pattern by providing relative movement of said electrode with respect to the conductive surface of the circuit board when the electrode tip is disposed in contact with the conductive surface and said voltage-applying means is actuated to apply voltage between said electrode and the conductive surface of the circuit board; and
   conductive material from the conductive surface of the circuit board being removed to produce a circuit pattern in the conductive surface of the circuit board corresponding to the plotting pattern when the electrode tip is in contact with the conductive surface and said voltage-applying means is actuated.

6. Apparatus as set forth in claim 5, wherein said electrode is vertically movable in a direction toward and away from the circuit board as received by the plotting device for disposing the electrode tip thereof in contact with the conductive surface of the circuit board and for removing the electrode tip thereof from contact with the conductive surface of the circuit board.

7. Apparatus as set forth in claim 5, wherein said electrode and the circuit board are both movable, said plotting device in which the circuit board is receivable being effective to move the circuit board in a Y-axis direction; and said electrode being movable in a X-axis direction in tracing out the plotting pattern when the electrode tip is disposed in contact with the conductive surface and said voltage-applying means is actuated to apply voltage between said electrode and the conductive surface of the circuit board.

8. Apparatus as set forth in claim 5, wherein the circuit board comprises a bass layer of Mylar film 9. Apparatus as set forth in claim 8, wherein the conductive surface on the circuit board is copper.

10. Apparatus as set forth in claim 5, wherein the voltage applied by said voltage-applying means between said electrode and the conductive surface of the circuit board is at a sufficient magnitude to vaporize the conductive surface in areas of contact between the electrode tip of said electrode and the conductive surface.

11. Apparatus as set forth in claim 5, further comprising a computer coupled to said plotting device, said computer being provided with control means interfacing with said plotting device for controlling said plotting device in drawing on the conductive surface of the circuit board via the electrode tip of said electrode in a plotting pattern as determined by said control means of said computer.

* * * * *